United States Patent [19]

Buck et al.

[11] Patent Number: 4,997,376

[45] Date of Patent: Mar. 5, 1991

[54] PAIRED CONTACT ELECTRICAL CONNECTOR SYSTEM

[75] Inventors: Jonathan E. Buck; William H. Rose, both of Harrisburg, Pa.

[73] Assignee: AMP Incorporated, Harrisburg, Pa.

[21] Appl. No.: 498,309

[22] Filed: Mar. 23, 1990

[51] Int. Cl.[5] .......... H05K 1/00

[52] U.S. Cl. .......... 439/59; 439/637; 439/630; 439/92; 439/660

[58] Field of Search .......... 439/59-62, 439/65, 92, 629-637, 660

[56] References Cited

U.S. PATENT DOCUMENTS

| | | | |
|---|---|---|---|
| 2,899,669 | 8/1959 | Johanson | 439/157 |
| 3,950,068 | 4/1976 | Schmeig | 439/660 |
| 4,572,604 | 2/1986 | Ammon et al. | 439/623 |
| 4,734,042 | 3/1988 | Martens et al. | 439/59 |
| 4,734,060 | 3/1988 | Kawawada et al. | 439/660 |

FOREIGN PATENT DOCUMENTS

| | | | |
|---|---|---|---|
| 1107967 | 3/1968 | United Kingdom | 439/660 |

*Primary Examiner*—David L. Pirlot
*Attorney, Agent, or Firm*—Allan B. Osborne

[57] ABSTRACT

A paired contact electrical connector system (10) having a pair of mateable connectors (12,14) each with respective contact sets (16,20) therein has been disclosed. More particularly contact set 16 includes a pair of contact elements (24,26) having blades (28) lying on opposite sides of fingers (50) on one connector (12) for being received between and electrically engaging a pair of spaced apart beams (68) on a pair of contact elements (64,66) comprising the other contact set (20) positioned in the other connector (14).

6 Claims, 6 Drawing Sheets

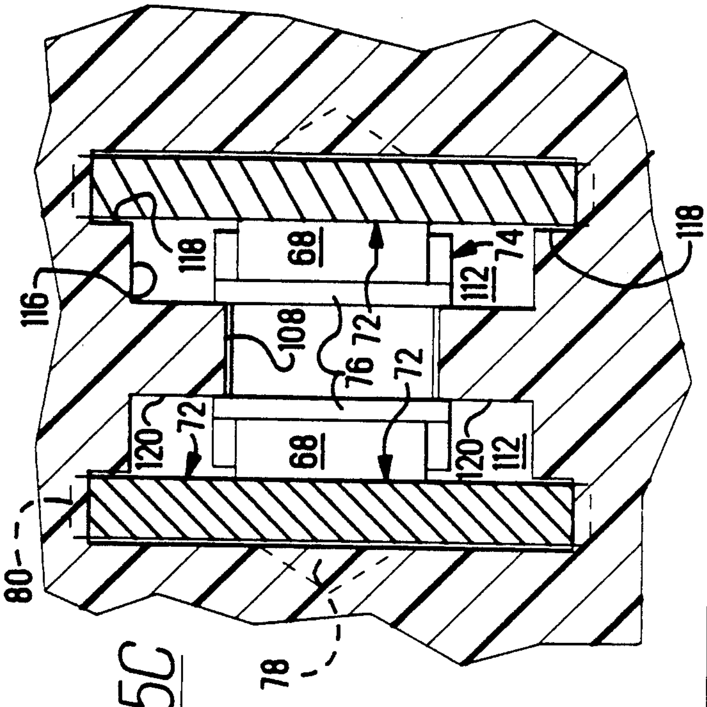
Figure 5C
Figure 5B
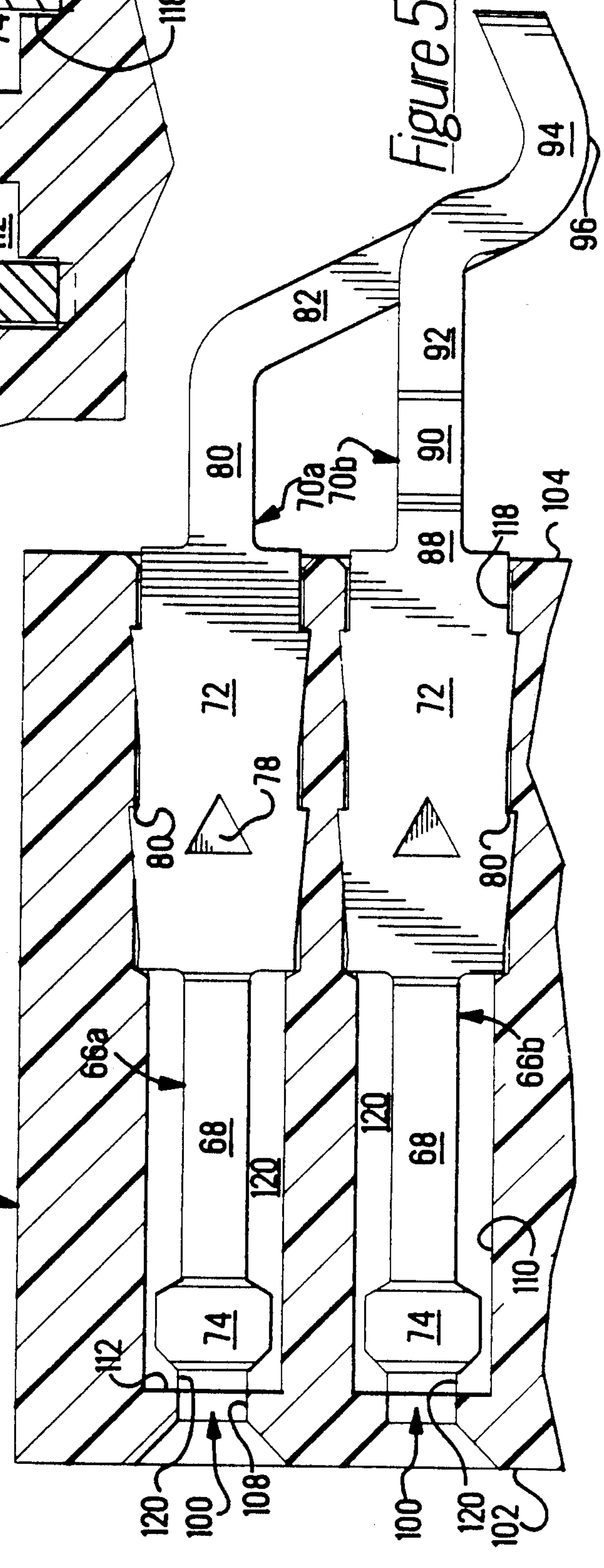

PAIRED CONTACT ELECTRICAL CONNECTOR SYSTEM

FIELD OF THE INVENTION

The present invention relates to a contact system having a pair of mateable connectors which carry contact sets having a signal contact element paired with a ground contact element.

BACKGROUND OF THE INVENTION

It is well known that in high speed and high frequency applications, the signals traveling through closely spaced signal lines interfere with each other and as a result, degenerate. Solutions to this problem include shielding each signal line and grounding the shielding. U.S. Pat. No. 4,070,751 discloses a method of terminating such a line; i.e., a coaxial cable, to a phono plug. However, this solution does not lend itself to high density applications such as in electronic equipment where interconnected printed circuit boards are employed. In those applications, workers in the field have developed two-piece connector systems wherein shielding plates are provided between adjacent rows of signal contact elements. These connector systems are disclosed in U.S. Pat. No. 4,846,727 and U.S. Application 07/434,616, filed November 9, 1989. In related work, workers have developed a coaxial contact element for use in the receptacle of the two piece connector systems wherein the signal contact element is nested within the ground contact element to provide a one to one signal-ground ratio. U.S. Application 07/372,403, filed June 26, 1989, discloses this coaxial contact element.

It is now proposed to provide a paired contact electrical connector system wherein the signal and ground contact elements are grouped in contact sets to provide a one to one signal-ground ratio.

SUMMARY OF THE INVENTION

According to the invention, a paired contact electrical connector system is provided which includes first and second mating connectors. The first connector includes contact sets formed by pairs of identical first contact elements with one element dedicated to a ground circuit and the other element dedicated to a signal circuit. The elements include blades on one end which lie on opposite sides of a finger which projects outwardly from one side of the housing. The two passages containing the elements are arranged around the finger to accommodate the positioning of the blades.

The second connector includes contact sets formed by pairs of symmetrical second contact elements with one element dedicated to a ground circuit and the other element dedicated to a signal circuit. Each pair of elements include cantilever beams which lie against opposite sides of a single passage and are spaced apart to receive the blades on a finger inserted therein whereupon separate ground and signal paths are established through the mated connectors.

BRIEF DESCRIPTION OF THE DRAWINGS

FIG. 5B is a sectioned side view of two passages such as shown in FIG. 5A; and

FIG. 5C is a sectioned end view of the passage shown in FIG. 5A.

DESCRIPTION OF THE INVENTION

Figure 1:
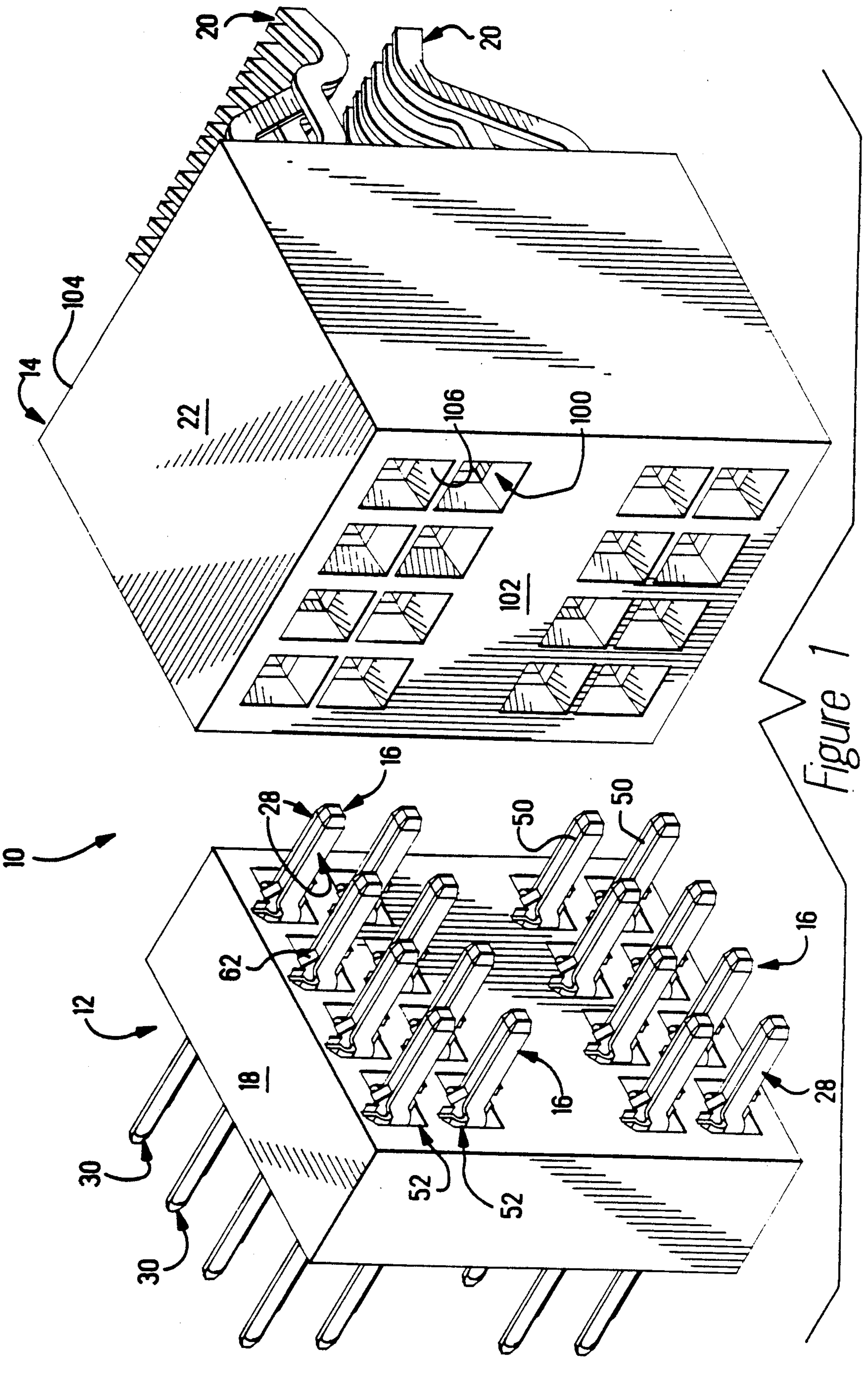
FIG. 1 is a perspective view of the two connectors forming the connector system of the present invention.

Paired contact electrical connector system 10 shown in FIG. 1 includes mateable first connector or pin header 12 on the left and a second connector or receptacle 14 on the right. Pin header 12 includes first contact sets 16 positioned in insulative housing 18. Receptacle 14 includes second and third contact sets 20 positioned in insulative housing 22.

Figure 2:
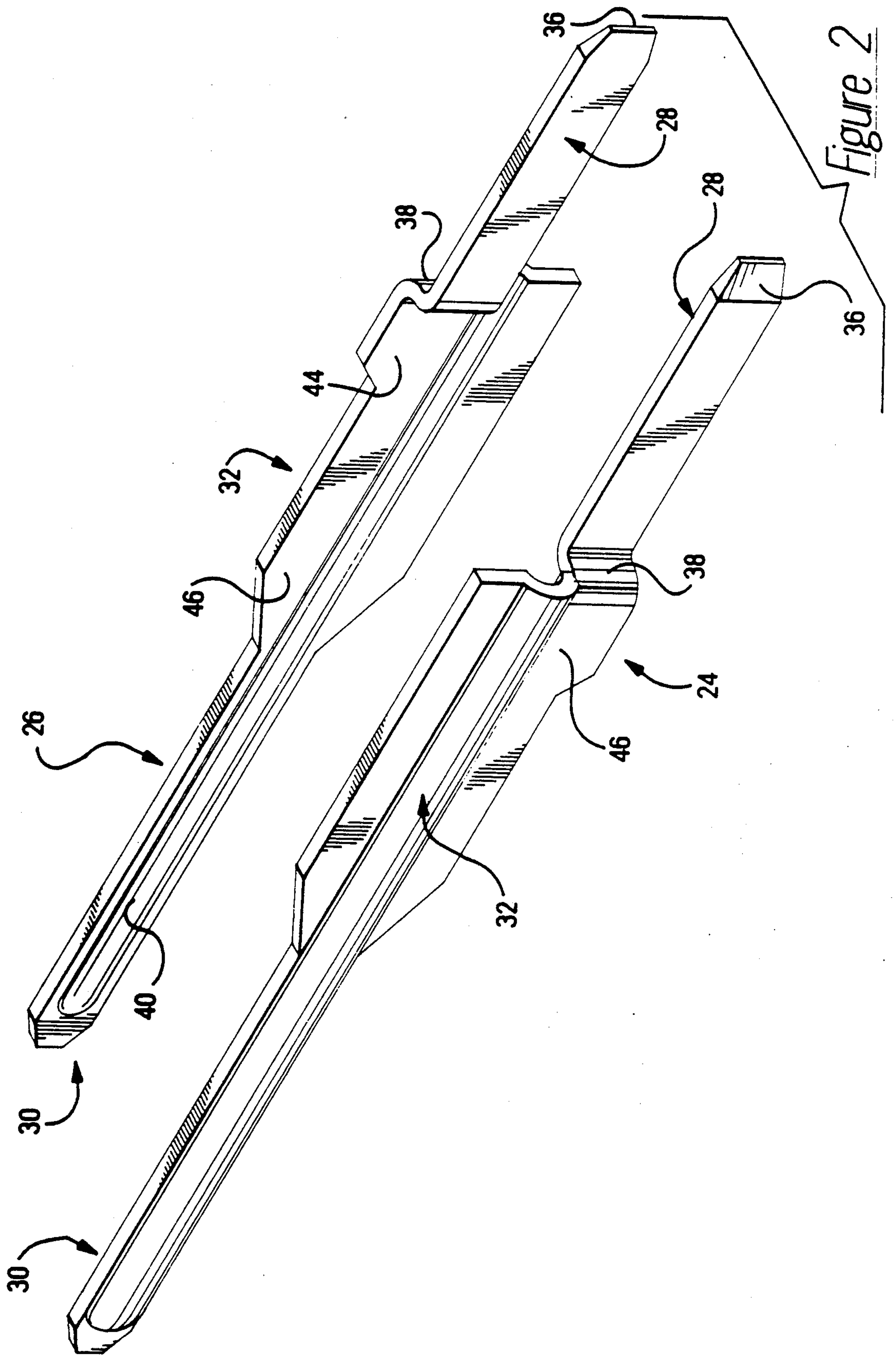
FIG. 2 is a perspective view of the pair of contact elements forming a contact set disposed in one connector.

Each first contact set 16 as shown in FIG. 2 includes two discrete contact elements 24,26 which are identical. Each element 24,26 includes blade 28 at one end, a lead 30 at an opposite end and a retention plate 32 in between.

Blade 28 includes a beveled tip 36 at one end and an offsetting strap 38 at an opposite end.

Lead 30 is provided with a C-shaped portion 40 by reason of channel 42 for insertion and soldering in a plated through hole in a circuit board (not shown).

Channel 42 continues across the length and on the inside surface 44 of retention plate 32 with wings 46,48 extending laterally from respective sides thereof.

As shown in FIG. 2, offsetting strap 38 of blade 28 is attached to the front edge of wing 46 so that blade 28 is offset relative to the rest of element 24,26.

Contacts 24,26 are stamped and formed from a coplanar stock of material, preferably beryllium copper.

Figures 3A, 3B:
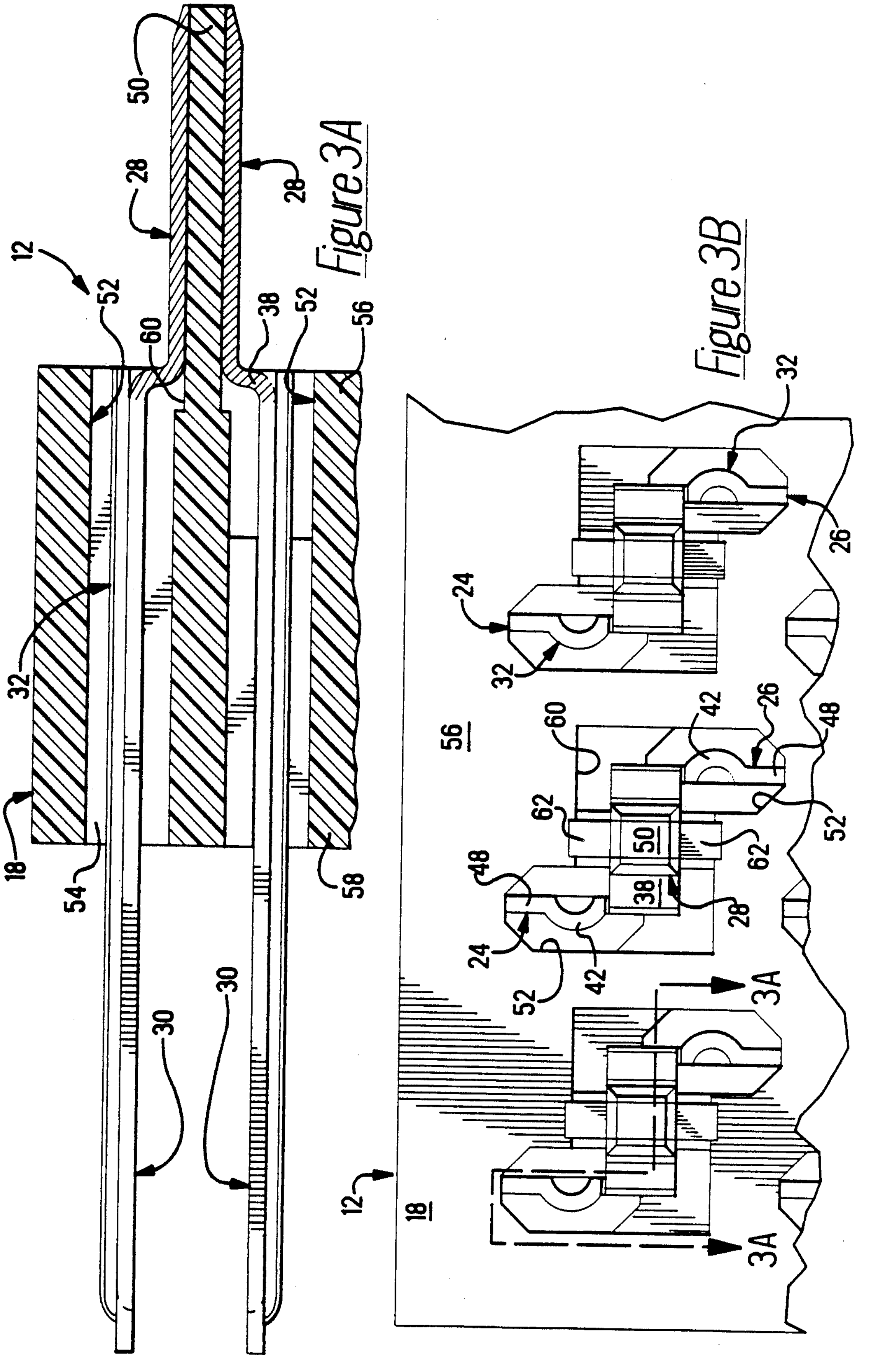
FIG. 3A is a sectioned side view of the one connector with the contact elements shown in FIG. 2 in the passages in the connector housing.
FIG. 3B is a sectioned top view of the one connector shown in FIG. 3A.

With reference to FIGS. 1 and more particularly 3A and 3B, housing 18 of pin header 12 includes outwardly extending fingers 50 and passages 52 which are arranged in sets of two around each finger 50. As shown in FIG. 3B, the two passages 52 in each set are rotated relative to the other and are at opposite ends and opposite sides of finger 50.

Each passage 52 includes a through portion 54 which opens onto front and rear end surfaces 56,58 respectively of housing 18. Additionally, each passage 52 includes a short portion 60 which extends into housing 18 from front end surface 56 for a short distance. Both portions 54,60 are open to each other over this common length.

Fingers 50 are supported on opposite sides by members 62 which project outwardly from housing front end surface 56.

Housing 18 is preferably molded from a suitable plastics material such as polyphenylene sulfide.

Contact elements 24,26 are positioned in each set of passages 52 with blades 28 lying against opposite sides of fingers 50, leads 30 extending outwardly from housing rear end surface 58 and retention plates 32 in through portions 54. Retention within passage 52 is provided by an interference fit between the free edges of wings 46,48 and the sides of portions 54. Blades 28 are pre-loaded to bear hard against finger 50.

Figure 4:
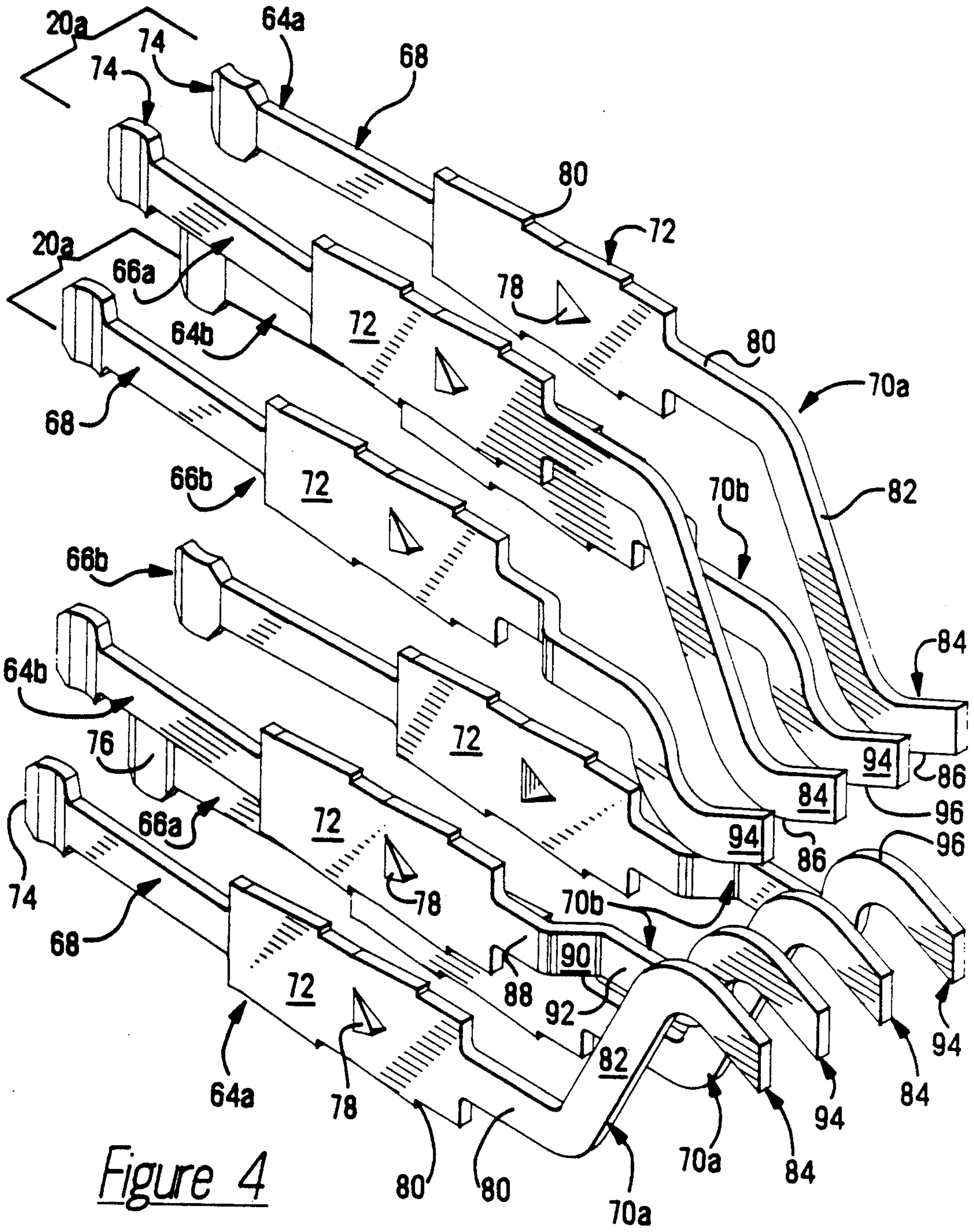
FIG. 4 is a perspective view of the pair of contact elements forming a contact set disposed in the other connector.

With reference to FIG. 4, second and third contact sets 20*a* and 20*b*, collectively contact sets 20, reflect structural differences in leads 70 as will be noted below. The contact sets 20*a*, 20*b* include respectively third and fourth contact elements 64*a*, 66*a* and fifth and sixth contact elements 64*b*, 66*b* (collectively elements 64,66) respectively. Elements 64,66 include beam 68 at one end, leads 70 at another end and retention plate 72 therebetween.

Figure 5A:
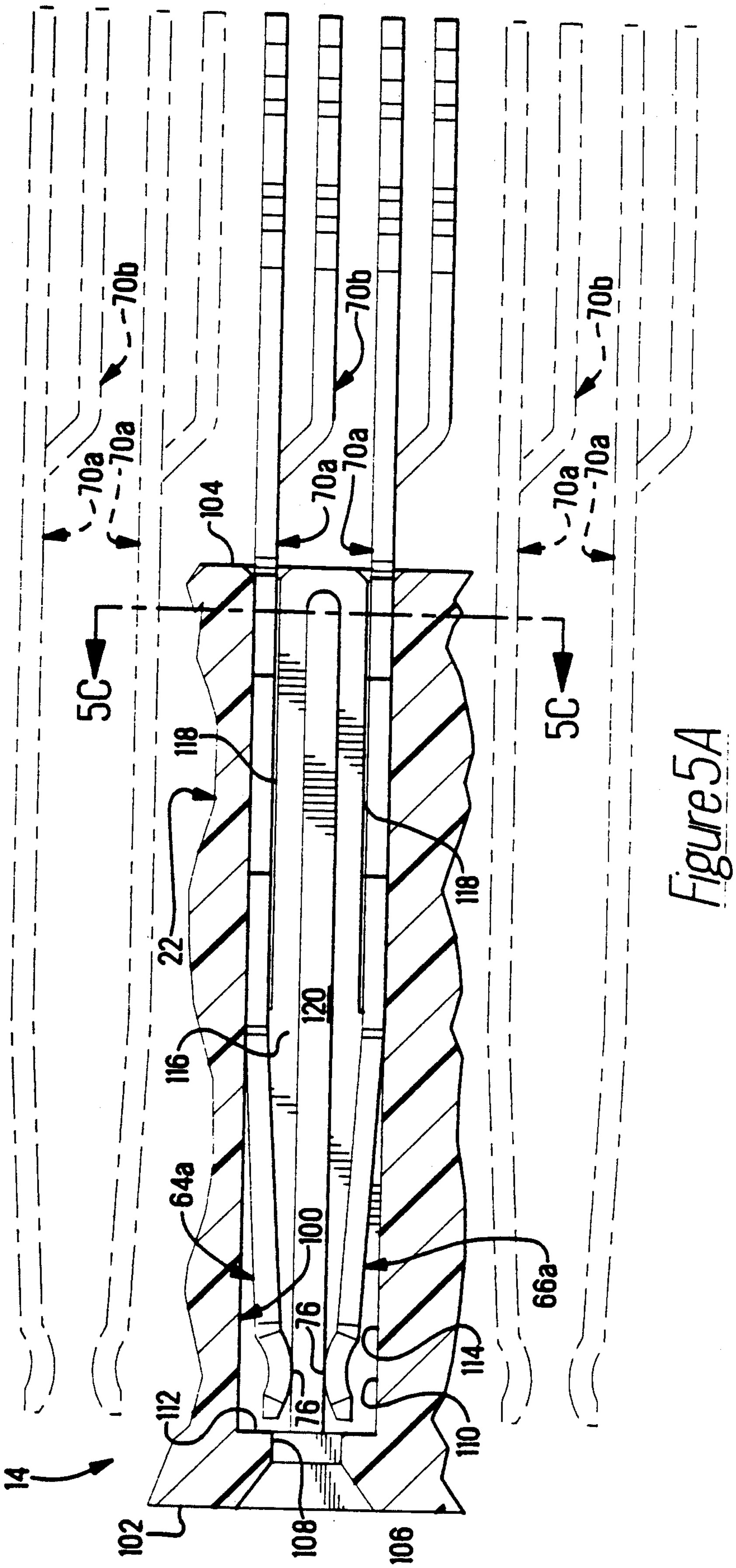
FIG. 5A is a sectioned top plan view of the other connector with the contact elements shown in FIG. 4 in a passage in the connector housing.

Beam 68 includes contact pads 74 at the free end with a convex surface 76 providing an electrical mating face as shown in FIG. 5A.

Plate 72 includes an outwardly projecting barb 78 and teeth 80 on each edge.

Leads 70*a* on elements 64*a*, 66*a* of second contact sets 20*a* are coplanar with retention plate 72 and include sections 80,82 and 84. Section 80 extends outwardly from plate 72, section 82 extends obliquely outwardly from section 80 and free end section 84 is arcuate-shaped with a convex contact surface 86.

Leads 70*b* on elements 64*b*, 66*b* of third contact sets 20*b* include a short straight section 88, offsetting strap 90, a second straight section 92, and an arcuate-shaped free end section 94 having a convex contact surface 96.

Contacts 64,66 are stamped and formed from a coplanar stock of material, preferably beryllium copper.

As shown in FIGS. 1, 5A, 5B and 5C, housing 22 of receptacle 14 includes passages 100 extending therethrough and opening onto front and rear surfaces 102,104 respectively. As shown in FIG. 5A, a passage 100 includes a funnel-shaped entrance 106 leading to gap 108 which connects entrance 106 to cavity 110 which opens onto rear surface 104. Cavity 110 is defined by rearwardly facing walls 112 and side walls 114,116 which are normal to each other. Further, as shown more clearly in FIG. 5C, grooves 118 are provided in walls 116 adjacent to walls 114 and inwardly projecting rails 120 extend into cavity 110 from the center. As shown in FIG. 5A, grooves 118 are in the approximate rear half of cavity 110 and are open at rear surface 104. Rails 120 extend rearwardly from walls 112 and terminate short of rear surface 104.

Housing 22 is preferably molded from a suitable plastics material such as a polyphenylene sulfide.

Each passage 100 receives one contact set 20. For example, as shown in FIG. 5A, contact elements 64*a*,66*a* are loaded into cavity 110 with respective convex surfaces 76 facing each other and with rails !20 therebetween as shown in FIG. 5C. The edges of plates 72 are received in grooves 118. Elements 64,66 are retained in cavities 110 by partially withdrawing them after full insertion (from the openings to passages 100 on rear surface 104) so that teeth 80 can dig into the housing material.

With reference to FIGS. 1 and 5B, contact sets 20*a*, 20*b* are loaded into adjacent rows of passages 100 so that convex contact surfaces 86 on contact elements 64*a*, 66*a* and convex contact surfaces 96 on contact elements 64*b*, 66*b* are on the same plane. Thus, for the four row receptacle 14 shown in FIG. 1, the upper and lower-most rows contain second contact sets 20*a* and the two inner-most rows contain third contact sets 20*b*. Leads 70*a*, 70*b* and more particularly respective convex contact surfaces 86,96 are positioned to engage circuits on both sides of a circuit board (not shown) which may be inserted in between the two spaced-apart levels of leads 70*a*, 70*b*.

FIG. 4 shows contact sets 20*a*, 20*b* in the same spatial position as they occupy in housing 22.

In use, leads 30 on each companion set of contact elements 24,26 are inserted into respective signal, ground circuits on a circuit board (not shown). Leads 70 on each companion set of contact elements 64,66 engage respective signal, ground circuits on a circuit board (not shown) to which receptacle 14 is attached. Thus, a one to one signal, ground ratio is provided. Alternatively, the circuits can be all signal, all ground or a mix as required by the user.

As can be discerned, a paired beamed contact system has been disclosed. The system includes mating contact sets in a pin header and in a receptacle. Each contact set includes an element for a signal circuit and an element for a ground circuit to provide a one to one signal-ground ratio for high speed, high density and matched impedance lines. The two elements in each contact set in the pin header include outwardly projecting blades positioned on opposite sides of a finger projecting outwardly from a dielectric housing. The two elements in each contact set in the receptacle includes cantilever beams positioned on opposite sides of a passage in the receptacle dielectric housing. The blades and finger are inserted into the passage with the respective beams electrically engaging the respective blades.

We claim:

1. A paired contact electrical connector system, comprising;

a first connector comprising a dielectric housing from which two parallel rows of spaced apart fingers extend outwardly and through which extend a plurality of passages, said passages being arranged in pairs with openings of each pair being on each side of respective said fingers, said first connector further comprising a plurality of first contact sets disposed in each pair of passages, each contact set having first and second contact elements which are interchangeable with each other, each element having a retention section for retaining said element in a passage, said retention section having a wing extending laterally from respective sides of a longitudinal groove, said element further having a blade extending outwardly from one of said wings. each of said sets of said first and second contact elements being respectively disposed in a pair of passages with said blades extending outwardly of said housing and alongside and biased against said finger associated with each of said pairs of passages; and a second connector comprising a dielectric housing having first and second parallel rows of passages, said passages being on a spacing to receive respective fingers on said first connector, said second connector further comprising a plurality of second and third contact sets disposed in said first and second rows of passages respectively; said second sets having a third and fourth contact element and said third sets having a fifth and six contact element, each of said contact elements having a retention section for retaining said element in a passage and a beam extending forwardly from said retention section, each of said contact elements of said second and third contact sets being disposed in respective passages and adjacent opposite sides thereof so that said beams engage respective blades on respective fingers inserted thereinto.

2. The electrical connector system of claim 1 wherein said contact elements further include leads extending outwardly from respective said retention sections and outwardly from respective housings for electrical engagement with electrical circuits.

3. The electrical connector system of claim 2 wherein said leads on said third through sixth contact elements include arcuate free end sections having a convex contact surface for engaging circuits on a circuit board and further including offsetting means on said leads on said fifth and sixth contact elements for laterally offsetting said arcuate free end sections relative to said associated retention sections.

4. The electrical connector system of claim 3 wherein said leads on said third and fourth contact elements include displacement means for displacing said arcuate free end sections to the same plane as said arcuate free end sections on said fifth and sixth contact elements.

5. The electrical connector system of claim 4 wherein said first connector includes another two parallel rows of spaced-apart fingers, pairs of passages associated with said another two rows of fingers, first contact sets disposed in said passages, and said second connector includes third and fourth parallel rows of passages on a spacing to respectively receive said another two rows of fingers on said first connector, and further including second and third contact sets disposed in said fourth and third rows of passages respectively with said convex contact surfaces on said contact sets in said first and second rows of passages and convex contact surfaces on said contact sets in said third and fourth rows of passages defining a space therebetween for receiving a circuit board.

6. The electrical connector system of claim 5 wherein said first, third and fifth contact elements engage one of either signal or ground circuits and said second, fourth and sixth contact elements engage the another of either signal or ground circuits.

* * * * *